United States Patent
Kitagawa et al.

(10) Patent No.: US 9,530,469 B2
(45) Date of Patent: Dec. 27, 2016

(54) INTEGRATED CIRCUIT SYSTEM WITH NON-VOLATILE MEMORY STRESS SUPPRESSION AND METHOD OF MANUFACTURE THEREOF

(71) Applicant: Sony Corporation, Tokyo (JP)

(72) Inventors: Makoto Kitagawa, Boise, ID (US); Tomohito Tsushima, Tokyo (JP); Wataru Otsuka, Boise, ID (US); Takafumi Kunihiro, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 108 days.

(21) Appl. No.: 13/843,306

(22) Filed: Mar. 15, 2013

(65) Prior Publication Data

US 2014/0268975 A1 Sep. 18, 2014

(51) Int. Cl.
G11C 13/00 (2006.01)
G11C 7/12 (2006.01)
G11C 7/18 (2006.01)

(52) U.S. Cl.
CPC .. *G11C 7/12* (2013.01); *G11C 7/18* (2013.01)

(58) Field of Classification Search
CPC ..................................................... G11C 13/00
USPC ..................................................... 365/185.25
See application file for complete search history.

(56) References Cited

U.S. PATENT DOCUMENTS

| 6,014,331 | A | * | 1/2000 | Chih .................. 365/185.25 |
| 6,418,046 | B1 | * | 7/2002 | Naji .................. G11C 11/1657 365/158 |
| 6,823,293 | B2 | | 11/2004 | Chen et al. |
| 7,616,050 | B2 | * | 11/2009 | Eckstein .................. 327/538 |
| 8,324,606 | B2 | | 12/2012 | Tsukamoto et al. |
| 2006/0120146 | A1 | * | 6/2006 | Ezaki et al. .................. 365/158 |
| 2009/0086534 | A1 | * | 4/2009 | DeBrosse .............. G11C 7/062 365/163 |
| 2009/0161449 | A1 | * | 6/2009 | Yamagami ............ G11C 11/419 365/189.16 |
| 2009/0323396 | A1 | * | 12/2009 | Inaba .................. G11C 11/16 365/148 |
| 2010/0195376 | A1 | * | 8/2010 | Yoon .................. G11C 11/16 365/158 |
| 2011/0267872 | A1 | * | 11/2011 | Toda .............................. 365/148 |
| 2012/0014167 | A1 | * | 1/2012 | Maejima .................. G11C 5/02 365/148 |
| 2012/0020141 | A1 | * | 1/2012 | Kitagawa ........... G11C 13/0009 365/148 |

(Continued)

FOREIGN PATENT DOCUMENTS

| CN | 101465160 | 6/2009 |
| CN | 102282621 | 12/2011 |
| CN | 102347074 | 2/2012 |

OTHER PUBLICATIONS

Official Action (with English translation) for Chinese Patent Application No. 201410086816.0 dated May 4, 2016, 18 pages.

*Primary Examiner* — Min Huang
(74) *Attorney, Agent, or Firm* — Sheridan Ross P.C.

(57) ABSTRACT

An integrated circuit system, and a method of manufacture thereof, including: an integrated circuit die; a non-volatile memory cell in the integrated circuit die and having a bit line for reading a data condition state of the non-volatile memory cell; and a voltage clamp in the integrated circuit die, the voltage clamp having a semiconductor switch connected to the bit line for reducing voltage excursions on the bit line.

8 Claims, 10 Drawing Sheets

(56) References Cited

U.S. PATENT DOCUMENTS

2013/0148406 A1* 6/2013 Shimakawa ........ G11C 11/1673
 365/148
2014/0063892 A1* 3/2014 Yip ................................ 365/72

* cited by examiner

INTEGRATED CIRCUIT SYSTEM WITH NON-VOLATILE MEMORY STRESS SUPPRESSION AND METHOD OF MANUFACTURE THEREOF

TECHNICAL FIELD

The present invention relates generally to an integrated circuit system, and more particularly to a system for integration of high-density non-volatile memory arrays in integrated circuit applications.

BACKGROUND ART

The trend for including ever-increasing amounts of memory in these devices with faster access and performance needs has presented challenges to the integrated circuit industry that impose conflicting requirements on the integrated circuits. In order to accommodate the increased amount of logic and memory, smaller and smaller geometries are required to contain the functions.

Memories such as non-volatile Flash memory or dynamic random access memory (DRAM) maintain the data content by storing charge within a physical structure in the memory cell. However, the pursuit for faster performing non-volatile memory having thinner crystalline structures associated with smaller geometry technologies often results in damage of the thinner crystalline structure or memory leak through of the physical structures.

Many approaches have been attempted to maintain data integrity while improving memory performance and reliability in view of the less reliable crystalline structures. Approaches such as wear leveling, variable error correction codes, and extended parity schemes have been used to mask the reliability issues of the smaller geometry crystalline structures.

Other memory technologies not dependent on storing charge within a physical structure are making their way to the main stream integrated circuit industry. These technologies include Resistive Random Access Memory (RRAM or ReRAM) and Conductive Bridging Random Access Memory (CBRAM), which can change resistance values when written or erased.

While these technologies show promise and these mechanisms can be utilized on any of the small geometry technologies, they have similar problems in terms of reliability and robustness resulting in limited production which prevents these technologies from reaching commodity status. The challenge continues for ways to provide consistent yield, reliability, and performance for popular commodity items like smart phones, digital cameras, global positioning systems, personal audio players, portable gaming devices.

Thus, a need still remains for an integrated circuit system with non-volatile memory. In view of the ever-increasing public demand to deliver more functionality, lower costs, and increased performance, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit system including: providing an integrated circuit die; forming a non-volatile memory cell in the integrated circuit die and having a bit line for reading a data condition state of the non-volatile memory cell; and forming a voltage clamp in the integrated circuit die, the voltage clamp having a semiconductor switch connected to the bit line for reducing voltage excursions on the bit line.

The present invention provides an integrated circuit system, including: an integrated circuit die; a non-volatile memory cell in the integrated circuit die and having a bit line for reading a data condition state of the non-volatile memory cell; and a voltage clamp in the integrated circuit die, the voltage clamp having a semiconductor switch connected to the bit line for reducing voltage excursions on the bit line.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
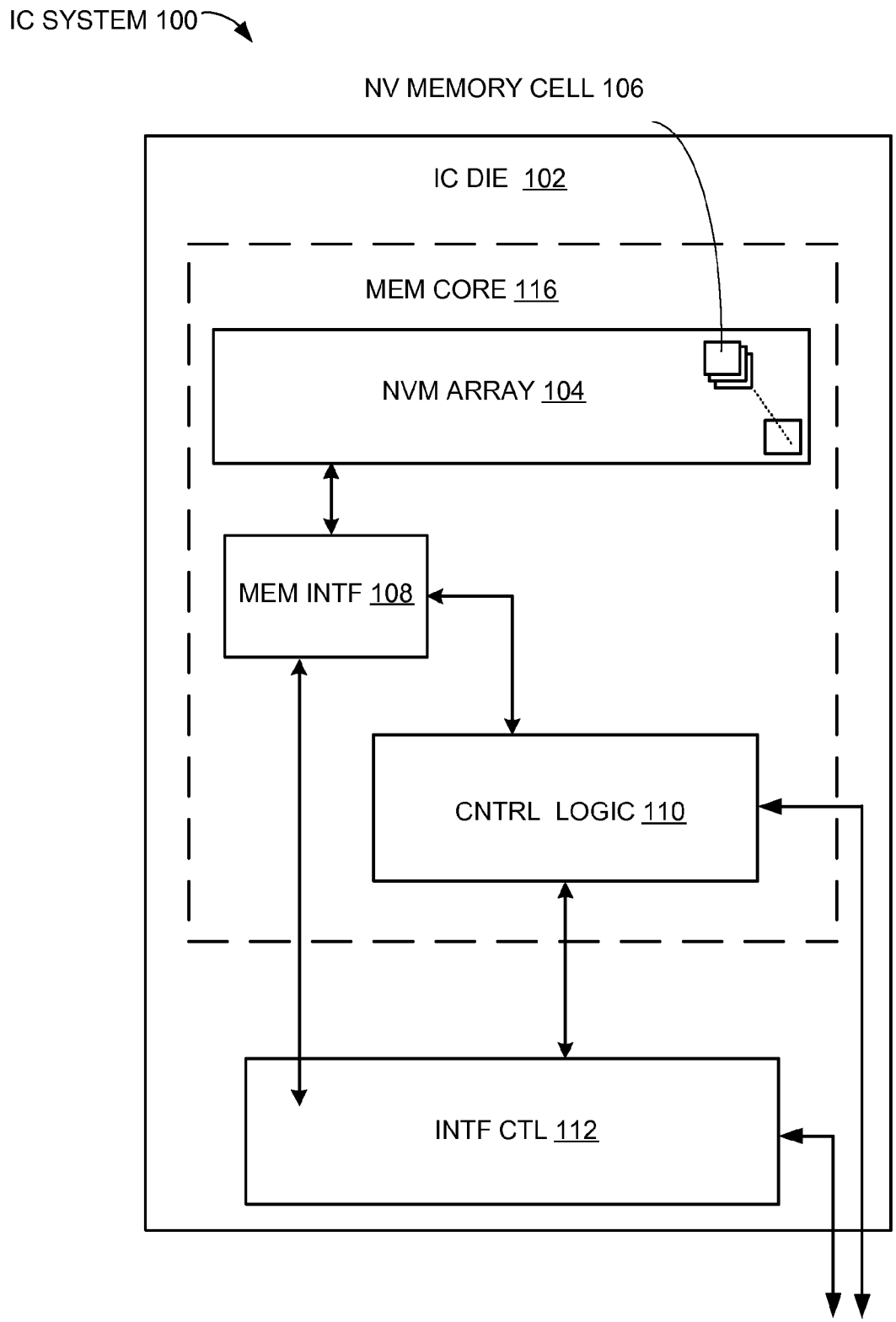
FIG. 1 is a block diagram of an integrated circuit system with a non-volatile memory array in a first example of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The schematic drawings are depicted based on an electron flow current convention. The drawings showing embodiments of the system are semi-diagrammatic and not to scale and, particularly, some of the dimensions are for the clarity of presentation and are shown exaggerated in the drawing FIGs.

Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the active surface of the integrated circuit die, regardless of its orientation. The term "vertical" refers to a direction perpendicular to the horizontal as just defined. The terms "formed" or "forming" as used herein is defined as semiconductor manufacturing processes involving semiconductor, conductive, insulative, or a combination of materials thereof, including usage of a photoresist, patterning, exposure, development, deposition, etching, cleaning, soldering, and/or removal of the material or photoresist as required for the formation of a described device and associated structure of the described device.

The terms "connected" or "connecting" as used herein is defined manufacturing processes involving semiconductor, conductive, or a combination of materials, used in the semiconductor manufacturing to processes to establish and maintain a permanent electrical contact between described elements, devices, or a combination thereof. Terms, such as "above", "below", "bottom", "top", "side" (as in "sidewall"), "higher", "lower", "upper", "over", and "under", are defined with respect to the horizontal plane, as shown in the figures. The term "on" means there is direct contact between identified elements with no other intervening elements between the identified elements.

Referring now to FIG. 1, therein is shown a block diagram of an integrated circuit system with a non-volatile memory in a first embodiment of the present invention. The block diagram of the integrated circuit system 100, also referred to as the IC SYSTEM, depicts an integrated circuit die 102, shown labeled and referred to as IC DIE, having a non-volatile memory array 104 formed with one or more of non-volatile memory cells 106.

Each of the non-volatile memory cells 106, are shown labeled and referred to as NV MEMORY CELL. The non-volatile memory cells 106 can be formed of a resistive memory cell of the type used in resistive random access memory (RRAM or ReRAM), conductive bridging random access memory (CBRAM), or any memory technology altering cell resistances to store a data condition state, such as a one (1) or a zero (0). The one (1) or zero (0) can also be referred to as set or reset, respectively. The data condition state of the non-volatile memory cells 106 can be referred to as memory contents or data information, processed or used by a program, a user, or an application. The data condition state previously stored in the non-volatile memory cells 106 can be determined by a memory read operation, also referred to as a read or a memory read, of the non-volatile memory cells 106 to determine its state, such as a one or a zero.

A memory write operation, also referred to as a memory store operation, is defined as processes refers to involved or associated with storing of a specific data condition state such as a one or a zero into the non-volatile memory cells 106. The specific data condition state can detected or observed with voltages in volts (V) of or currents in amperes (A) through the non-volatile memory cells 106. For example with a RRAM or ReRAM, the non-volatile memory cells 106 and is directly related to the cell resistance of each of the non-volatile memory cells 106 altered as a result of the memory write operation.

A memory read operation is defined as processes involved or associated with determining the current data condition state or the data condition state at the time of the memory read operation. For example with a RRAM or ReRAM, the current data condition of the non-volatile memory cells 106 is determined by detecting or monitoring voltages in volts (V) of or currents in amperes (A) through the actual cell resistance of each of the non-volatile memory cells 106 at the time of the memory read.

A memory interface 108 can be coupled to the non-volatile memory array 104. The memory interface 108, shown labeled and referred to as MEM INTF, can include analog circuitry, digital circuitry, or a combination thereof. The memory interface 108, for example, can include sense amplifiers, address drivers, voltage sources, current sources, an analog to digital converter (ADC), data integrity checking logic, and switching logic required to address and effect the state of the non-volatile memory cells 106 within the non-volatile memory array 104, shown labeled and referred to as NVM ARRAY.

A control logic 110 can access the memory interface 108 in order to utilize the non-volatile memory array 104. The control logic 110, shown labeled and referred to as CTRL LOGIC, can include a sequential processor, a bit-slice processor, a micro-processor, or a combinational logic control array (not shown). The control logic 110 can be coupled to the non-volatile memory array 104 to perform operations to the non-volatile memory array 104 in order to write, read, or erase the non-volatile memory cells 106. The control logic 110 can also provide error correction algorithms in order to maintain the integrity of user data stored in the non-volatile memory array 104.

The control logic 110 can be coupled to an interface module 112 for communication within or outside boundaries of the integrated circuit die 102. The interface module 112, shown labeled and referred to as INTF CTL, can also be coupled to the memory interface 108 for efficient transfer of multiple blocks of the user data to or from the non-volatile memory array 104 without direct intervention of the control logic 110.

The interface module 112 can also provide connection paths between from the integrated circuit die 102 and a next level of integration (not shown), such as a circuit board, an external electronic device, a user interface, one or more power source, one or more ground reference, or a combination thereof. A combination of the non-volatile memory array 104, the control logic 110, and the memory interface 108 can be referred to as a non-volatile memory core 116. The non-volatile memory core 116 is shown labeled and referred to as MEM CORE.

It is understood that the description of the integrated circuit system 100 is to clarify the invention and is not intended to limit the scope or architecture of the integrated circuit die 102. It is further understood that additional functions can be implemented in the integrated circuit die 102 that can operate in concert or replace some of the previously defined blocks.

Figure 2:
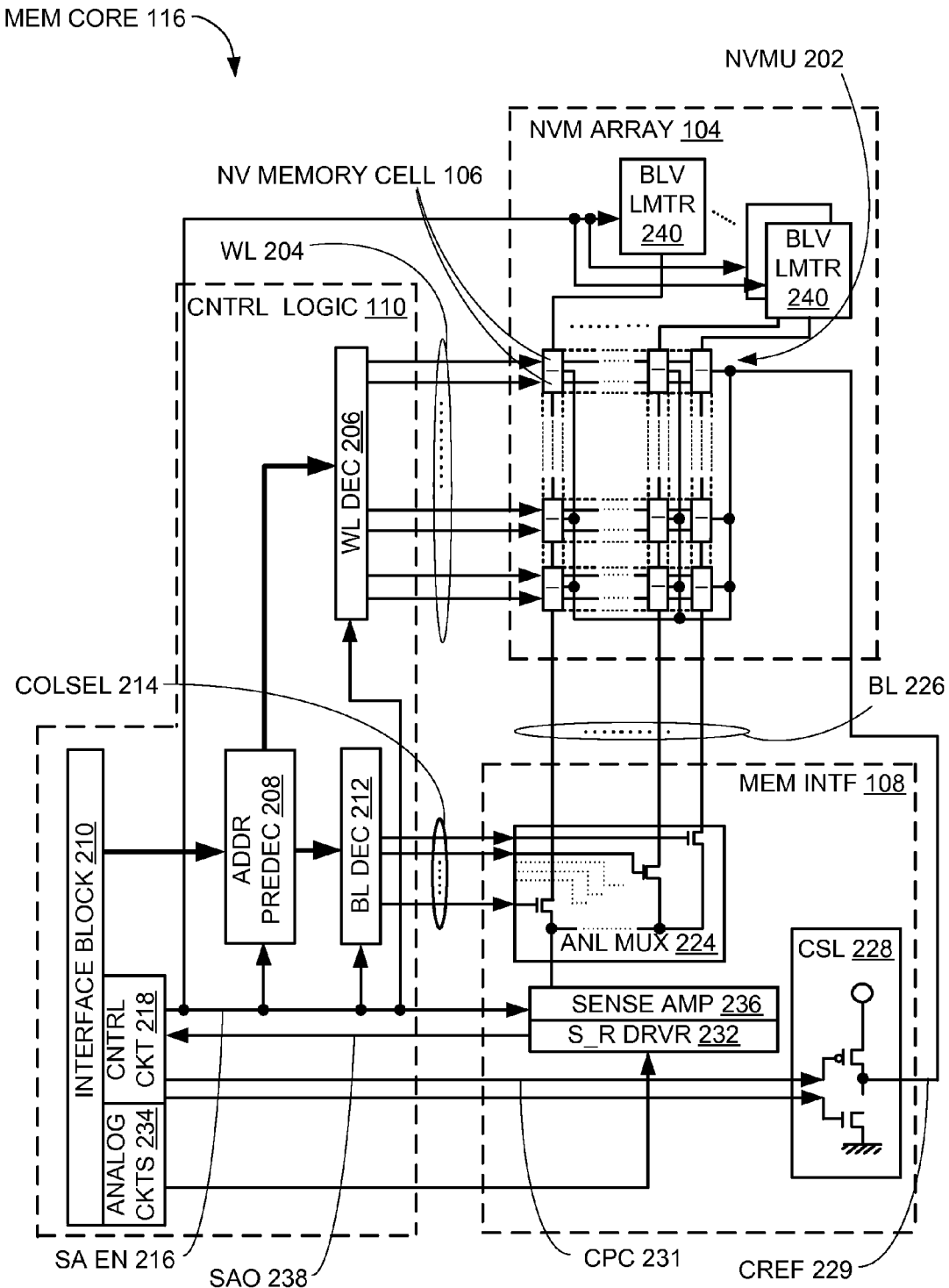
FIG. 2 is a block diagram of functions within the non-volatile memory core of FIG. 1.

Referring now to FIG. 2, therein is shown a block diagram of functions within the non-volatile memory core 116 of FIG. 1. Shown are functional components and signal paths within the non-volatile memory array 104, the memory interface 108, and the control logic 110 of the integrated circuit system 100 of FIG. 1.

The non-volatile memory array 104 can include non-volatile memory units 202, shown, labeled, and referred to, as NVMU. Each of the non-volatile memory units 202 can be formed having two of the non-volatile memory cells 106.

It is understood that the non-volatile memory units 202 can be formed having any number of the non-volatile memory cells 106. For example, each of the non-volatile memory units 202 could be formed having only one of the non-volatile memory cells 106. In another example, each of the non-volatile memory units 202 could be formed having four of the non-volatile memory cells 106.

For purposes of discussion, it is understood that the non-volatile memory array 104 contains more than one of the non-volatile memory cells 106. The non-volatile memory cells 106 in the non-volatile memory array 104, can be physically formed into one or more of the non-volatile memory units 202 having one or more of the non-volatile memory cells 106.

The non-volatile memory cells 106 of the non-volatile memory array 104 can be configured in a multi-dimensional memory array, such as in rows and columns. The non-volatile memory cells 106 in any one of the rows can be individually written with the memory write operation, such as to set the data condition or reset the data condition, or determine the current data condition using the memory read operation. The non-volatile memory cells 106 of in one or more rows can be concurrently set or reset in any combination or read as complete rows.

The rows having the non-volatile memory cells 106 in the non-volatile memory array 104 can be selected using word lines 204 from a word line decoder 206 of the control logic 110. The word lines 204 and the word line decoder 206 are shown, labeled, and referred to, as WL and WL DEC, respectively. The word line decoder 206 receives physical row address information from an address pre-decoder 208 shown, labeled, and referred to as ADR PREDEC.

The address pre-decoder 208 decodes a logical address received by the non-volatile memory core 116 from an interface block 210 in the interface module 112 of FIG. 1 and generates the physical row address information for the word line decoder 206 and physical column address information for a bit line decoder 212 shown, labeled, and referred to as BL DEC.

The bit line decoder 212 of the control logic 110 decodes the physical column address information from the address pre-decoder 208 and generates column select lines 214 shown, labeled, and referred to as COLSEL. The address pre-decoder 208 and the bit line decoder 212 can optionally receive a sense amplifier enable 216 signal, shown and referred to as SA EN, from control circuit 218 shown, labeled, and referred to as CNTRL CKT, to validate or latch the word lines 204 and the column select lines 214, respectively.

The column select lines 214 from the bit line decoder 212 is used by an analog multiplexor 224 input to connect or select the memory interface 108 to one or more of the non-volatile memory cells 106 of the non-volatile memory array 104 using a combination of the word lines 204 and bit lines 226. The bit lines 226 are shown, labeled, and also referred to as BL. The non-volatile memory cells 106, specifically connected or selected by the connection or selection of one or more of the word lines 204 and the bit lines 226 can be accessed using the memory read operation, the memory write operation, or a combination of operations thereof.

The bit lines 226 and the word lines 204 enable for the reading of the data condition state of the non-volatile memory cells 106, as-well-as for the writing of the non-volatile memory cells 106 to set or program the data condition state. The bit lines 226 can be connected to one end of an altering cell resistance material of each of the non-volatile memory cells 106. An opposite end of the altering cell resistance material can be connected to a cell supply level 228, shown labeled and referred to as CSL, of a cell reference 229 shown labeled and referred to as CREF. The cell supply level 228, controlled by power sela 230 and power selb 231 selection signals from the control circuit 218, can be used to select from one of four internal voltage level or grounds. The power sela 230 and the power selb 231 selection signals shown, labeled, and referred to as PWR SELA and PWR SELB, respectively, can be used to select a specific voltage or ground to the cell reference 229 output of the cell supply level 228 for the memory write operations or the memory read operations.

The memory write operation to effectively change the resistance of the non-volatile memory cells 106 to one or more range of pre-determined targeted resistance values used to represent a one or a zero can be performed using voltage applied to or current flowing through each of the non-volatile memory cells 106, using the bit lines 226.

In a first example, the bit lines 226 can be pulsed at a voltage potential while the cell reference 229 is pulsed at a voltage potential significantly lower than the bit lines 226 to store the data condition state of a zero. In a second example, the bit lines 226 can briefly sources a current while the cell reference 229 briefly sinks most of the current to store the data condition state of a zero.

In a third example, the bit lines 226 can be pulsed at a voltage potential while the cell reference 229 is pulsed at a voltage slightly lower than the voltage potential of the bit lines. In a fourth example, the bit lines 226 can briefly sources a current while the cell reference 229 briefly sinks a portion of the current to store the data condition state of a zero.

The memory write operation can use different voltages or currents applied to the bit lines 226. The voltages or currents can be generated by a set_reset driver 232 of the memory interface 108 and analog circuits 234 of the control logic 110. The set_reset driver 232 and the analog circuits 234 are shown, labeled, and referred to as S_R DRVR and ANALOG CKTS, respectively. The voltages or currents of the cell reference 229 can be provided by the analog circuits 234 with the control circuit 218 of the control logic 110 controlling the cell supply level 228.

The memory read operation does not use the set_reset driver 232 to generate voltages or currents to read the non-volatile memory cells 106. Instead a sense amplifier 236, shown and labeled as SENSE AMP, is used during memory read operations to generate a current-limited read source current through the bit lines 226 into the non-volatile memory cells 106 while the cell reference 229 is connected to a local ground from the sense amplifier 236 of the integrated circuit die 102.

During the memory read operation, the sense amplifier 236 can also determine either amount of the current flowing through the altered cell resistance of each of the non-volatile memory cells 106 or a voltage across the altered cell resistance. Since the bit lines 226 are clamped and silent or quiesced during read, the amount of current through or the voltage across each of the non-volatile memory cells 106 can be used to indicate resistance to determine the data condition state of each of the non-volatile memory cells 106 read.

A sense amplifier output 238, shown labeled and referred to as SAO, signal from the sense amplifier 236 is sent to the control circuit 218. The sense amplifier output 238 is sent to the control circuit 218 to indicate to an originator (not shown) of the memory read request, such as client, an application, or circuitry, whether each of the non-volatile memory cells 106 read has a data condition state of a zero or one, such as a binary value of zero or one.

The altered cell resistance of the non-volatile memory cells 106 having a data condition state of a one can range between one hundred thousand ohms and two hundred thousand ohms. The altered cell resistance of the non-volatile memory cells 106 having a data condition state of a zero can range between four hundred thousand ohms and one million ohms.

A voltage clamp or bit line voltage limiter 240, shown, labeled, and referred to as BLV LMTR, is connected to each of the bit lines 226 to limit or clamp the voltages to a pre-determined threshold level that occurs when the non-volatile memory cells 106 being read is in a high resistive state (HRS). The high resistive state (HRS) can also referred as the data condition state of a one. The low resistive state (LRS) can also referred as the data condition state of a zero.

The bit line voltage limiter 240 eliminates the occurrences from excess voltages across the non-volatile memory cells 106 as a result of the altered cell resistance when the data condition state is in the HRS window. The read current source from the sense amplifier 236 is current-limited to a current needed to provide fast switching performance, between the HRS and LRS states, while not exceeding user design constraints such as power consumption budgets, noise budgets, increase in design complexity, manufacturing/test costs, or reducing the reliability and life expectancy of the non-volatile memory core 116.

The current limiting of the read current source can be based on the lowest anticipated altered cell resistance which occurs when the non-volatile memory cells 106 is in the LRS state. The sense amplifier enable 216 can be used to enable the bit line voltage limiter 240, only during the memory read operations, and not during the memory write operations.

It has been discovered that the bit line voltage limiter 240 designed to be active only during memory reads of the non-volatile memory cells 106 in the HRS state and not interfere with the memory reads of the LRS state or the memory write operations provide the benefits of improved memory reliability while preserving the user design constraints.

It has been discovered that the bit line voltage limiter 240 reduces or eliminates voltage spikes for the non-volatile memory cells 106 operating as a single level cell (SLC) or as a multiple level cell (MLC).

It has been discovered that the bit line voltage limiter 240 provides maximum timing performance while eliminating stress related failures and significantly reduce read disturb issues by preventing excessive voltages during memory reads of memory cells in a high resistive switch (HRS) data condition state.

It has been discovered that the bit line voltage limiter 240 of the integrated circuit system 100 with the non-volatile memory cells 106 will function properly as either in a unipolar or bipolar memory configuration.

Figure 3:
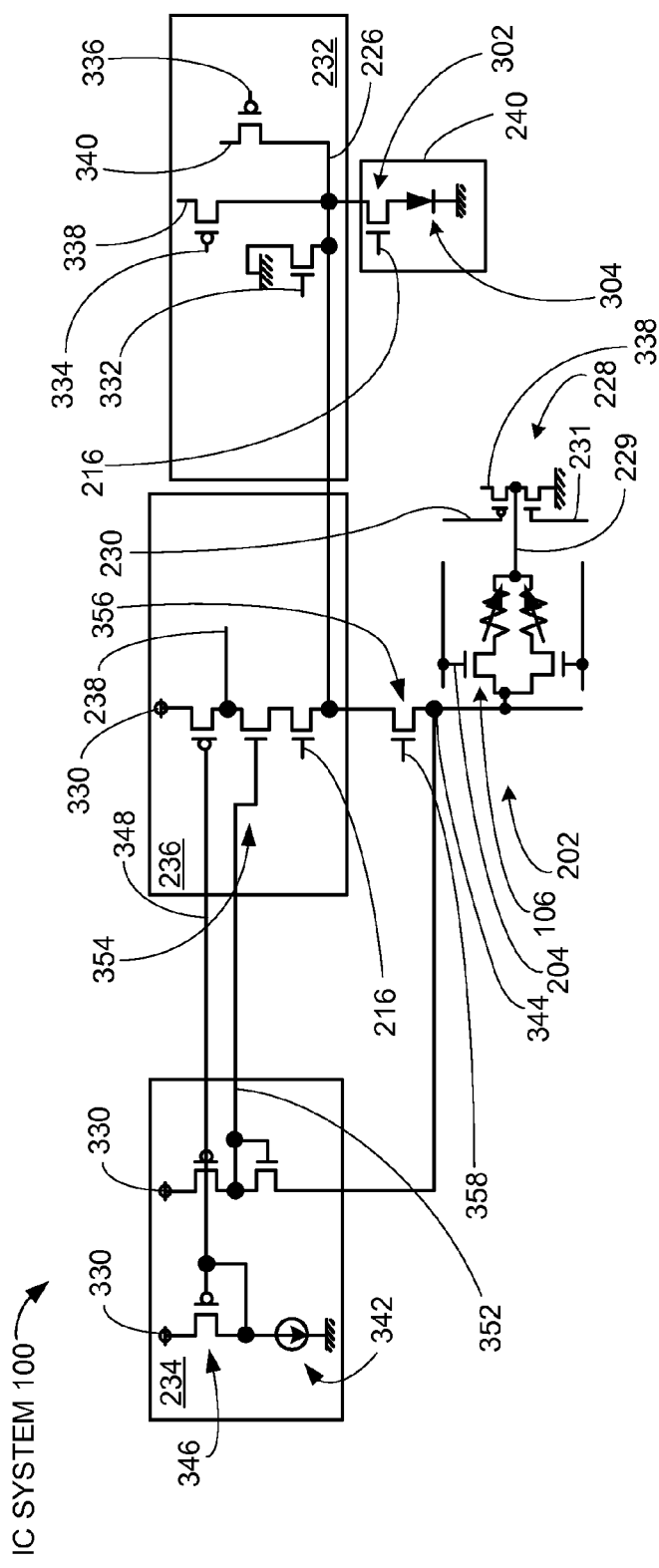
FIG. 3 is an exemplary schematic diagram of portions of FIG. 2 having a first example of the voltage clamp for the memory read and the memory write operations.

Referring now to FIG. 3, therein is shown an exemplary schematic diagram of portions of FIG. 2 having a first example of the voltage clamp for the memory read and the memory write operations. Shown are schematics representations of portions of the analog circuits 234, the sense amplifier 236, the set_reset driver 232, the cell supply level 228, and one of the non-volatile memory units 202 having two of the non-volatile memory cells 106.

The memory clamp circuitry or the bit line voltage limiter 240 is formed having a semiconductor switch 302, such as a transistor, a field effect transistor (FET), a N-type material pass gate switch device, an N-channel FET device, or an NMOS device. The semiconductor switch 302 of the bit line voltage limiter 240 can be connected to a shunt device or a diode 304 of the bit line voltage limiter 240 having a forward bias voltage drop of $V_F$ to limit the voltage drop across each of the non-volatile memory cells 106.

The cathode of the diode 304 can be connected directly to ground, a local ground, or an analog ground and the anode of the diode 304 is connected directly to one end of the semiconductor switch 302. Another end of the semiconductor switch 302, opposite the end of the semiconductor switch 302 connected to the anode of the diode 304, can be connected directly to one of the bit lines 226 of the non-volatile memory cells 106. The diode 304 of the bit line voltage limiter 240 can be formed connected to the semiconductor switch 302 with the semiconductor switch 302 between the bit lines 226 and the diode 304 and forward-biased to the ground.

The bit line voltage limiter 240 connected between the one of the bit lines 226 and the ground can be enabled only for the memory read operations for reducing or eliminating the voltage peaks or excursions beyond a voltage threshold ($V_{th}$) maximum attributed to the diode 304 $V_F$, the forward voltage of the diode 304. The bit line voltage limiter 240 can be isolated or disconnected from the one of the bit lines 226 for any of the memory write operations using the sense amplifier enable 216. The sense amplifier enable 216 can control the semiconductor switch 302 to enable or disable the operation of the bit line voltage limiter 240 for memory read operations or memory write operations, respectively.

The one of the bit lines 226 is also connected to a source of an NMOS device output of the sense amplifier 236. The drain of the NMOS device is driven by a source of a cascaded NMOS device output in the sense amplifier 236. A drain of the cascaded NMOS device is driven by a drain of a PMOS device of the sense amplifier 236 used to generate the sense amplifier output 238 sent to the control circuit 218 of FIG. 2.

A source of the PMOS device of the sense amplifier 236 can be connected to the ref nodes 330. The ref nodes 330 are connection points connected to analog current or voltage reference nodes from the analog circuits 234 for proper operation of the various circuitries shown and other circuitries (not shown) within the non-volatile memory core 116 of FIG. 2. The sense amplifier 236 operates as described in detail for FIG. 2 in this specification.

The one of the bit lines 226 is also connected to circuitry of the set_reset driver 232 used to generate voltages or currents for the memory write operations as described in detail for FIG. 2 in this specification. The circuitry of the set_reset driver 232 is disabled during memory read operations by a combination of drive bit line lowlevel 332, drive bit line setlevel 334, and drive bit line resetlevel 336 from the control circuit 218 of FIG. 2 or optionally with the sense amplifier enable 216 from the control circuit 218.

The combination of the drive bit line lowlevel 332, the drive bit line setlevel 334, and the drive bit line resetlevel 336, shown and a referred to as DBL LOW, DBL SL, and DBL RL respectively, are used to perform the memory write operation. Also, the circuitry of the set_reset driver 232 uses a set reference voltage 338 and a reset reference voltage 340 from the analog circuits 234, and a ground, such as a local ground or an analog ground, to set the non-volatile memory cells 106 to the data condition state of a one or a zero using the memory write operation.

The analog circuits 234 are shown including a current reference 342 used by the sense amplifier 236, when reading the data condition state with the bit lines 226 is biased at node_vread 344 for memory read operations, to drive a cell current thru the bit lines 226. The cell current from the current reference 342 is matched to a memory cell resistance referred to as a resistance threshold ($R_{th}$) of the non-volatile memory cells 106 that defines a resistance value from which HRS and LRS are determined. For example, the HRS would be defined for a range of resistances that are greater than $R_{th}$ and the LRS would be defined for a range of resistances that are less than the $R_{th}$.

A PMOS diode 346 in series with the current reference 342 is used to drive the sense amplifier as a current mirror and can be referred to a vgp_iref 348. Current of the vgp_iref 348 mirrors the current reference 342 when the PMOS diode 346 operates or works in the saturation region.

Voltage of the bit lines 226 is clamped by v_clamp 352 when the current reference 342 flows through a cascade device 354, such as an NMOS, of the sense amplifier 236 during the read operations. The source of the cascade device 354 device is sent through a NMOS device controlled by the sense amplifier enable 216 signal to the drain of a semiconductor bl fanout device 356, such as a NMOS device. Portions of circuitry used to generate the v_clamp 352 can be distributed to circuitry of the sense amplifier 236.

An first end of the non-volatile memory cells 106, opposite a second end of the non-volatile memory cells 106 coupled to the one of the bit lines 226, can be directly attached to ground using the cell reference 229 from the cell supply level 228 for the memory read operations. One of the word lines 204 is shown connected to the one of the non-volatile memory cells 106 to enable selection of the one of the non-volatile memory cells 106 as described in detail for FIG. 2 in this specification.

The second end of the non-volatile memory cells 106 is directly attached to a source of the semiconductor bl fanout device 356 and is shared with many other of the non-volatile memory cells 106 connecting to the one of the bit lines 226. The semiconductor bl fanout device 356 can be controlled by y_sel 358 and provides fanout load and current drive capabilities between the non-volatile memory cells 106 and the sense amplifier 236 and the set_reset driver 232.

It has been discovered that the bit line voltage limiter 240 with the semiconductor switch 302 and the shunt device or the diode 304 are designed to be active only during memory reads of the non-volatile memory cells 106 in the HRS state and not interfere with the memory reads of the LRS state or the memory write operations provide the benefits of improved memory reliability while preserving the user design constraints.

It has been discovered that the bit line voltage limiter 240 with the semiconductor switch 302 and the shunt device or the diode 304 reduces or eliminates voltage spikes for the non-volatile memory cells 106 operating as a single level cell (SLC) or as a multiple level cell (MLC).

It has been discovered that the v_clamp 352 and the cascade device 354 device combined with the semiconductor switch 302 and the shunt device or the diode 304 of the bit line voltage limiter 240 increases the signal-to-noise ratio of the bit lines 226 for reliable and accurate read registration of the data condition state from the sense amplifier output 238 of the non-volatile memory cells 106.

It has been discovered that the bit line voltage limiter 240 with the semiconductor switch 302 and the shunt device or the diode 304 provides maximum timing performance while eliminating stress related failures and significantly reducing read disturb issues by preventing excessive voltages during memory reads of memory cells in a high resistive switch (HRS) data condition state.

It has been discovered that the combination of the semiconductor bl fanout device 356 and the bit line voltage limiter 240 results in the non-volatile memory cells 106 having compact and small circuit areas with benefits of low manufacturing cost and complexity.

Figure 4:
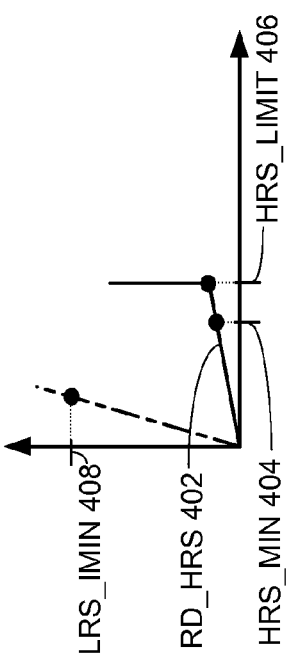
FIG. 4 is a current versus voltage line graph exemplifying the voltage clamp of FIG. 3 for the memory read operations.

Referring now to FIG. 4, therein is shown a current versus voltage line graph exemplifying the voltage clamp of FIG. 3 for the memory read operations. The line graph shows a Y-axis is used to indicate current increasing in a vertical direction away from the X-axis. The X-axis is used to indicate voltage increasing in a horizontal direction away from the Y-axis.

Rd_hrs 402 is a plot showing voltages of the bit lines 226 of FIG. 3 and associated current flow values through the non-volatile memory cells 106 while reading a high resistance state (HRS). HRS_MIN 404 identifies a voltage on the X-axis representing the minimum voltage needed to validate the data condition state as being the HRS of a one. HRS_LIMIT 406 indicates a pre-selected voltage limit provided by the voltage threshold $V_{th}$ of the bit line voltage limiter 240 of FIG. 3 to the bit lines 226 of FIG. 3.

The current versus voltage line graphs clearly show how the bit line voltage limiter 240 prevents voltage peaks or excursions beyond the pre-determined limit of the HRS_LIMIT 406. For comparative purposes, LRS_IMIN 408, plotted with long-short lines, shows a minimum current needed to flow through the bit lines 226 to validate the data condition state as being the low resistance state (LRS) and is not affected by the bit line voltage limiter 240.

It has been discovered that the bit line voltage limiter 240 attached directly to the bit lines 226 formed and configured with the shunt device or the diode 304 and the semiconductor switch 302 described in FIG. 3 provides improved timing performance by permitting higher currents with bounded HRS voltage excursions.

It has been discovered that the bit line voltage limiter 240 attached directly to the bit lines 226 formed and configured with the shunt device or the diode 304 and the semiconductor switch 302 described in FIG. 3 provides substantial reliability improvements by reducing read disturb errors and by extending the mean time between failures (MTBF) of the non-volatile memory cells 106.

Figure 5:
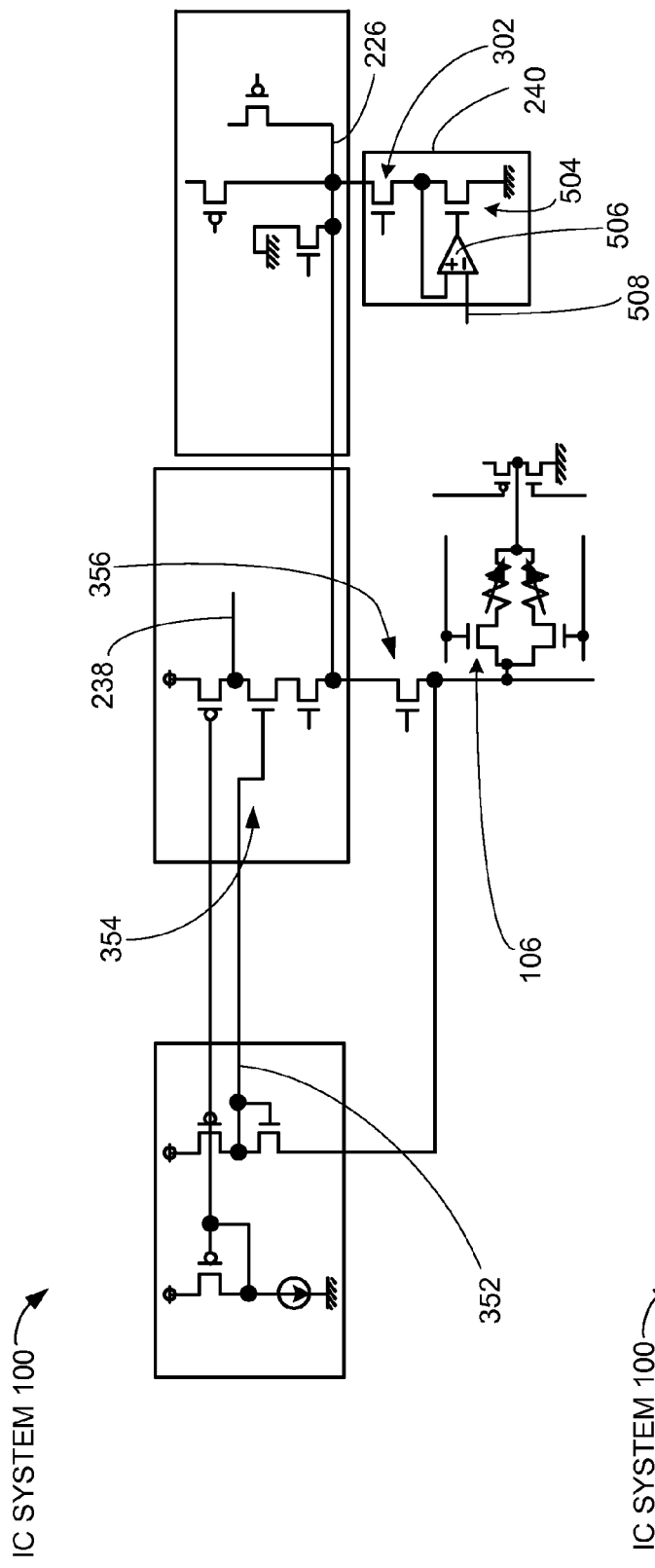
FIG. 5 is the exemplary schematic diagram of FIG. 3 having a second example of the voltage clamp for the memory read and the memory write operations.

Referring now to FIG. 5, therein is shown the exemplary schematic diagram of FIG. 3 having a second example of the voltage clamp for the memory read and the memory write operations. The voltage clamp or the bit line voltage limiter 240 is formed the semiconductor switch 302 and can be connected to a shunt device or a semiconductor current sink 504 of the bit line voltage limiter 240, such as the semiconductor switch 302, controlled by an operational amplifier 506 (OP-amp) to limit the voltage drop across the non-volatile memory cells 106.

The semiconductor current sink 504 and the operational amplifier 506 can be included in the bit line voltage limiter 240. An end of the semiconductor current sink 504 can be connected directly to the ground and another end of the semiconductor current sink 504, opposite the end connected to the ground, can be connected directly to the one end of the semiconductor switch 302. The another end of the semiconductor switch 302 can be connected directly to one of the bit lines 226 of the non-volatile memory cells 106. The semiconductor current sink 504 of the bit line voltage limiter 240 can be formed connected to the semiconductor switch 302 with the semiconductor switch 302 between the bit lines 226 and the semiconductor current sink 504.

A non-inverting input and output of the operational amplifier 506 are connected to a control, such as a gate of a transistor, of the semiconductor current sink 504. The non-inverting input of the operational amplifier 506 used to receive a voltage feedback from the output of the semiconductor switch 302. The bit line voltage limiter 240 can include an inverting input of the operational amplifier 506 connected to voltage referred to and shown as vsafe 508 to set or adjust the $V_{th}$ and current sunk through the semiconductor current sink 504 to ground.

The vsafe 568 voltage, determined by cell characterization of the non-volatile memory cells 106, is received from a digital to analog converter (DAC), not shown. The DAC can be located is the analog circuits 234. The voltage threshold ($V_{th}$) voltage can be equaled to a voltage level of the vsafe 508. The combination of the semiconductor switch 302, the semiconductor current sink 504, the operational amplifier 506, and the vsafe 508, can form a voltage controlled current sink with an adjustable and accurate $V_{th}$ and having characteristics of an ideal current sink to ground device.

It has been discovered that the accuracy of a voltage controlled current sink using the shunt device or the semiconductor current sink 504 controlled by the operational amplifier 506 (OP-amp) to limit the voltage drop across the non-volatile memory cells 106 provides maximum timing performance while eliminating stress related failures and significantly reduce read disturb issues by preventing excessive voltages during memory reads of memory cells in a high resistive switch (HRS) data condition state.

It has been discovered that the bit line voltage limiter 240, having the semiconductor switch 302 with the shunt device or the semiconductor current sink 504 controlled by the operational amplifier 506 with feedback, attached directly to the bit lines 226 and described in FIG. 5 provides improved timing performance by permitting higher currents with bounded HRS voltage excursions.

It has been discovered that the v_clamp 352 and the cascade device 354 device combined with the semiconductor switch 302 and the shunt device or the semiconductor current sink 504 controlled by the operational amplifier 506 of the bit line voltage limiter 240 increases the signal-to-noise ratio of the bit lines 226 for reliable and accurate read registration of the data condition state from the sense amplifier output 238 of the non-volatile memory cells 106.

It has been discovered that the bit line voltage limiter 240 attached directly to the bit lines 226 formed and configured having the semiconductor switch 302 with the shunt device or the semiconductor current sink 504 controlled by the operational amplifier 506 and described in FIG. 5 provides substantial reliability improvements by extending the mean time between failures (MTBF) of the non-volatile memory cells 106.

It has been discovered that the combination of the semiconductor bl fanout device 356 and the bit line voltage limiter 240 results in the non-volatile memory cells 106 having compact and small circuit areas with benefits of low manufacturing cost and complexity.

Figure 6:
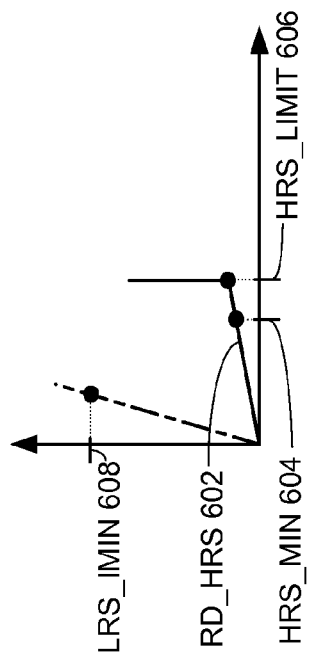
FIG. 6 is the current versus voltage line graph exemplifying the voltage clamp of FIG. 5 for the memory read operations.

Referring now to FIG. 6, therein is shown the current versus voltage line graph exemplifying the voltage clamp of FIG. 5 for the memory read operations. The line graph shows a Y-axis is used to indicate current increasing in a vertical direction away from the X-axis. The X-axis is used to indicate voltage increasing in a horizontal direction away from the Y-axis.

Rd_hrs 602 is a plot showing voltages of the bit lines 226 of FIG. 5 and associated current flow values through the non-volatile memory cells 106 while reading a high resistance state (HRS). Hrs_min 604 identifies a voltage on the X-axis representing the minimum voltage needed to validate the data condition state as being the HRS of a one. HRS_LIMIT 606 indicates a pre-selected voltage limit provided by the voltage threshold $V_{th}$ of the bit line voltage limiter 240 of FIG. 5 to the bit lines 226 of FIG. 5.

The current versus voltage line graphs clearly show how the bit line voltage limiter 240 prevents voltage peaks or excursions beyond the pre-determined limit of the HRS_LIMIT 606. For comparative purposes, LRS_IMIN 608, plotted with long-short lines, shows a minimum current needed to flow through the bit lines 226 to validate the data condition state as being the low resistance state (LRS) and is not affected by the bit line voltage limiter 240.

It has been discovered that the bit line voltage limiter 240 attached directly to the bit lines 226 formed and configured with the semiconductor switch 302 with the shunt device or the semiconductor current sink 504 controlled by the operational amplifier 506 described in FIG. 5 provides improved timing performance by permitting higher currents with bounded HRS voltage excursions.

Figure 7:
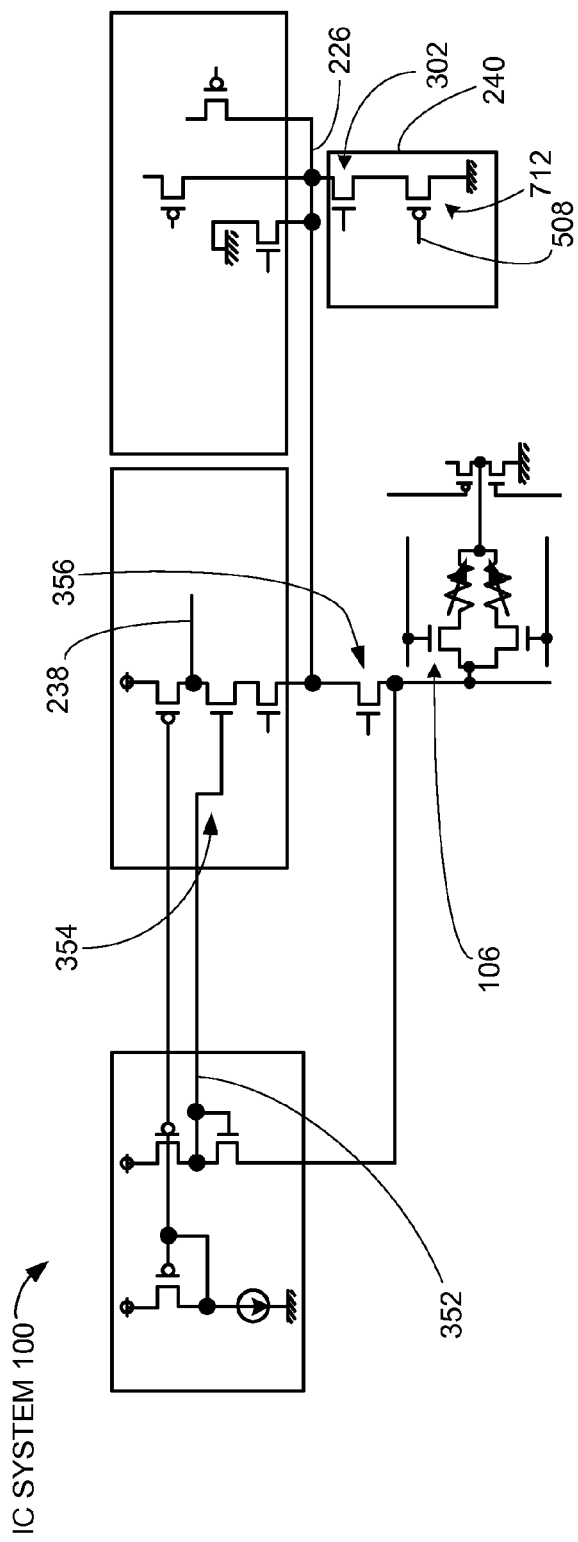
FIG. 7 is the exemplary schematic diagram of FIG. 3 having a third example of the voltage clamp for the memory read and the memory write operations.

Referring now to FIG. 7, therein is shown the exemplary schematic diagram of FIG. 3 having a third example of the voltage clamp for the memory read and the memory write operations. The voltage clamp or the bit line voltage limiter 240 is formed having the semiconductor switch 302 and can be connected to a shunt device or a noise immune semiconductor current sink 712 of the bit line voltage limiter 240, such as a transistor, a field effect transistor (FET), a P-type pass gate switch device, a P-channel FET device, or a PMOS device.

An end of the noise immune semiconductor current sink 712 can be connected directly to the ground and another end of the noise immune semiconductor current sink 712, opposite the end connected to ground, can be connected directly to the end of the semiconductor switch 302. The another end of the semiconductor switch 302 can be connected directly to one of the bit lines 226 of the non-volatile memory cells 106. The noise immune semiconductor current sink 712 of the bit line voltage limiter 240 can be formed connected to the semiconductor switch 302 with the semiconductor switch 302 between the bit lines 226 and the noise immune semiconductor current sink 712.

The voltage threshold, $V_{th}$ is equaled to a summation of the vsafe 508 voltage and a $V_{gs}$ voltage. The $V_{gs}$ voltage is equal to the voltage magnitude difference between the voltage of the vsafe 508 and voltage at the end of the noise immune semiconductor current sink 712 connected directly to the end of the semiconductor switch 302. The combination of the semiconductor switch 302, the semiconductor current sink 504, the operational amplifier 506, and the vsafe 508, can form a voltage controlled current sink with an adjustable and accurate $V_{th}$ and having characteristics of an ideal current sink to ground device.

It has been discovered that the accuracy the voltage clamp provided by the combination of the semiconductor switch 302, the semiconductor current sink 504, the operational amplifier 506 with feedback, and the vsafe 508, provides substantial memory stress suppression resulting in improving the reliability of resistive non-volatile memory.

It has been discovered that the bit line voltage limiter 240 attached directly to the bit lines 226 formed and configured having the semiconductor switch 302 with the shunt device or the noise immune semiconductor current sink 712 as described in FIG. 7 provides improved timing performance by permitting higher currents with bounded HRS voltage excursions.

It has been discovered that the v_clamp 352 and the cascade device 354 device combined with the semiconductor switch 302 and the shunt device or the noise immune semiconductor current sink 712 of the bit line voltage limiter 240 increases the signal-to-noise ratio of the bit lines 226 for reliable and accurate read registration of the data condition state from the sense amplifier output 238 of the non-volatile memory cells 106.

It has been discovered that the bit line voltage limiter 240 attached directly to the bit lines 226 formed and configured having the semiconductor switch 302 with the shunt device or the noise immune semiconductor current sink 712 as described in FIG. 7 provides substantial reliability improvements by extending the mean time between failures (MTBF) of the non-volatile memory cells 106.

It has been discovered that the combination of the semiconductor bl fanout device 356 and the bit line voltage limiter 240 results in the non-volatile memory cells 106 having compact and small circuit areas with benefits of low manufacturing cost and complexity.

Figure 8:
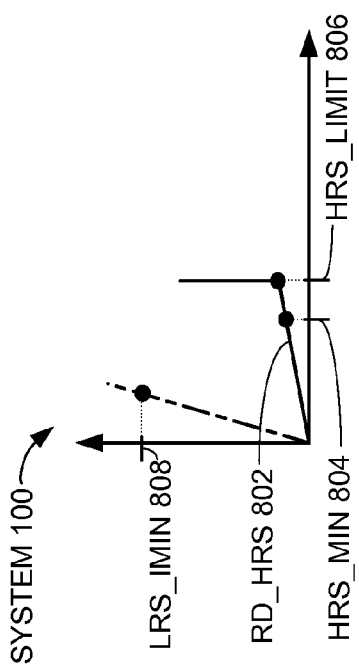
FIG. 8 is the current versus voltage line graph exemplifying the voltage clamp of FIG. 7 for the memory read operations.

Referring now to FIG. 8, therein is shown the current versus voltage line graph exemplifying the voltage clamp of FIG. 7 for the memory read operations. The line graph shows a Y-axis is used to indicate current increasing in a vertical direction away from the X-axis. The X-axis is used to indicate voltage increasing in a horizontal direction away from the Y-axis.

RD_HRS 802 is a plot showing voltages of the bit lines 226 of FIG. 5 and associated current flow values through the non-volatile memory cells 106 while reading a high resistance state (HRS). HRS_MIN 804 identifies a voltage on the X-axis representing the minimum voltage needed to validate the data condition state as being the HRS of a one. HRS_LIMIT 806 indicates a pre-selected voltage limit provided by the voltage threshold $V_{th}$ of the bit line voltage limiter 240 of FIG. 7 to the bit lines 226 of FIG. 7.

The current versus voltage line graphs clearly show how the bit line voltage limiter 240 prevents voltage peaks or excursions beyond the pre-determined limit of the HRS_LIMIT 806. For comparative purposes, LRS_IMIN 808, plotted with long-short lines, shows a minimum current needed to flow through the bit lines 226 to validate the data condition state as being the low resistance state (LRS) and is not affected by the bit line voltage limiter 240.

It has been discovered that the bit line voltage limiter 240 attached directly to the bit lines 226 formed and configured having the semiconductor switch 302 with the shunt device or the noise immune semiconductor current sink 712 as described in FIG. 7 provides improved timing performance by permitting higher currents with bounded HRS voltage excursions over other bit lines.

It has been discovered that the bit line voltage limiter 240 attached directly to the bit lines 226 formed and configured having the semiconductor switch 302 with the shunt device or the noise immune semiconductor current sink 712 as described in FIG. 7 provides substantial reliability improvements by extending the mean time between failures (MTBF) of the non-volatile memory cells 106.

Figure 9:
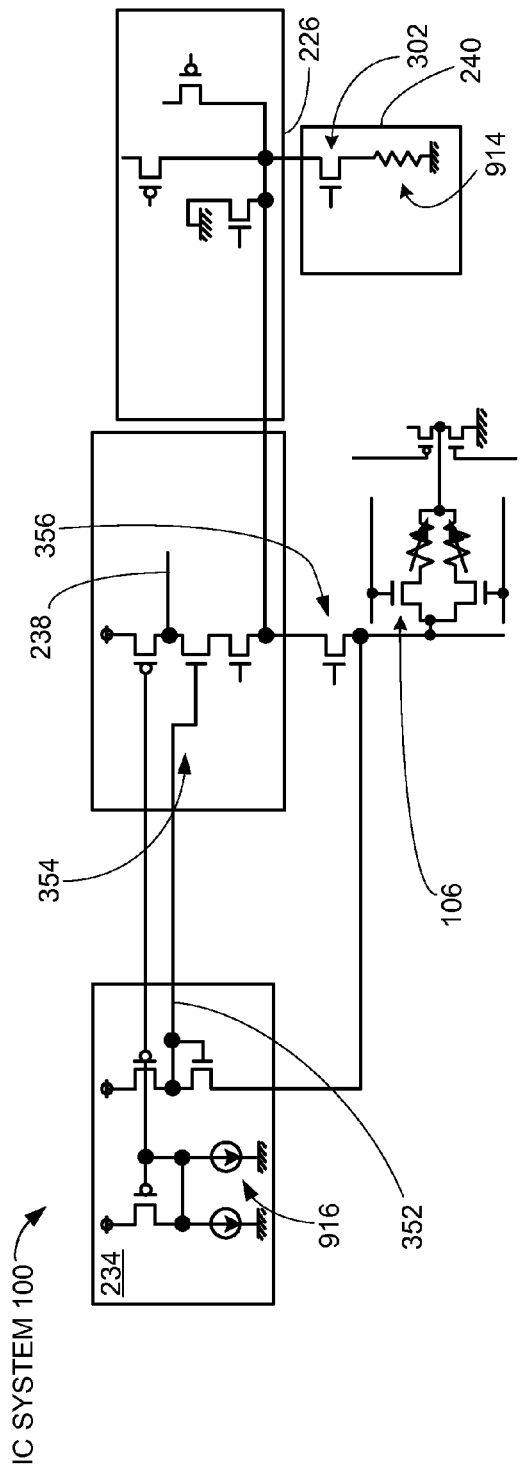
FIG. 9 is the exemplary schematic diagram of FIG. 3 having a fourth example of the voltage clamp for the memory read and the memory write operations.

Referring now to FIG. 9, therein is shown the exemplary schematic diagram of FIG. 3 having a fourth example of the voltage clamp for the memory read and the memory write operations. The voltage clamp or the bit line voltage limiter 240 is formed having the semiconductor switch 302 and can be connected to a shunt device or a resistive compensation device 914, such as a fixed or thermal sensitive resistor, a silicon iron temperature stable resistor, a stabistor, or a temperature varying resistance thermistor or a negative coefficient zener diode.

An end of the resistive compensation device 914 of the bit line voltage limiter 240 can be connected directly to the ground and another end of the resistive compensation device 914, opposite the end connected to ground, can be connected directly to the end of the semiconductor switch 302. The another end of the semiconductor switch 302 can be connected directly to one of the bit lines 226 of the non-volatile memory cells 106. The resistive compensation device 914 can be formed connected to the semiconductor switch 302 with the semiconductor switch 302 between the bit lines 226 and the resistive compensation device 914.

The bit line voltage limiter 240 with the resistive compensation device 914 in parallel with the bulk resistance of the non-volatile memory cells 106 result in a net current flow reduction through the non-volatile memory cells 106. The net current flow reduction through the non-volatile memory cells 106 reduces the voltage at the one of the bit lines 226 to clamp down the voltage applied to the one of the bit lines 226.

The clamp down the voltage applied to the one of the bit lines 226 is defined as the clamp down voltage differential. The clamp down voltage differential can be a result of the additional current flow provided by the resistive compensation device 914, shown and represented as additional current 916, in the analog circuits 234.

The resistive compensation device 914 can optionally be formed having a resistance, variable as a function of temperature, to reduce or eliminate any voltage peak or excursion beyond a voltage threshold ($V_{th}$) maximum by reducing the resistance as temperature increases. The combination of the semiconductor switch 302 and the resistive compensation device 914 can provide a simple, low cost, and self-managed implementation for the bit line voltage limiter 240.

It has been discovered that the bit line voltage limiter 240 attached directly to the bit lines 226 formed and configured having the semiconductor switch 302 with the shunt device or the resistive compensation device 914 as described in FIG. 9 provides improved timing performance by permitting higher currents with bounded HRS voltage excursions.

It has been discovered that the v_clamp 352 and the cascade device 354 device combined with the semiconductor switch 302 and the shunt device or the resistive compensation device 914 of the bit line voltage limiter 240 increases the signal-to-noise ratio of the bit lines 226 for reliable and accurate read registration of the data condition state from the sense amplifier output 238 of the non-volatile memory cells 106.

It has been discovered that the bit line voltage limiter 240 attached directly to the bit lines 226 formed and configured with the semiconductor switch 302 and the shunt device or the resistive compensation device 914 described in FIG. 9 provides substantial reliability improvements by extending the mean time between failures (MTBF) of the non-volatile memory cells 106.

It has been discovered that the combination of the semiconductor bl fanout device 356 and the bit line voltage limiter 240 results in the non-volatile memory cells 106 having compact and small circuit areas with benefits of low manufacturing cost and complexity.

Figure 10:
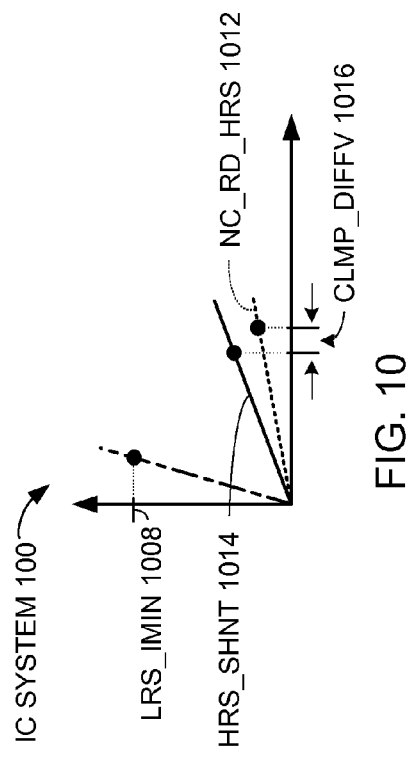
FIG. 10 is the current versus voltage line graph exemplifying the voltage clamp of FIG. 9 for the memory read operations.

Referring now to FIG. 10, therein is shown the current versus voltage line graph exemplifying the voltage clamp of FIG. 9 for the memory read operations. The line graph shows a Y-axis is used to indicate current increasing in a vertical direction away from the X-axis. The X-axis is used to indicate voltage increasing in a horizontal direction away from the Y-axis.

LRS_IMIN 1008, plotted with long-short lines, shows a minimum current needed to flow through the bit lines 226 to validate the data condition state. The LRS_IMIN 1008 plot indicates the low resistance state (LRS) and is not affected by the bit line voltage limiter 240.

NC_RD_HRS 1012 is a plot showing voltages of the bit lines 226 of FIG. 5 and associated current flow values through the non-volatile memory cells 106 without any benefit of the resistive compensation device 914 of the bit line voltage limiter 240. HRS_SHNT 1014 is a plot showing the non-volatile memory cells 106 with the resistive compensation device 914 of the bit line voltage limiter 240. The clamp down voltage differential can be shown and referred to as CLMP_DIFFV 1016 in the line graph.

The current versus voltage line graphs clearly show how the bit line voltage limiter 240 reduces voltage peaks to prevent voltage excursions detrimental to the performance or reliability of the non-volatile memory cells 106. Also shown is a maximum voltage threshold 1018 ($V_{th}$), shown and referred to as MAX_VTH, set by the resistance at a pre-determined temperature threshold by the resistive compensation device 914 chosen and formed to have a resistance that varies with temperatures.

It has been discovered that the bit line voltage limiter 240 attached directly to the bit lines 226 formed and configured having the semiconductor switch 302 and can be connected to the shunt device or the resistive compensation device 914 described in FIG. 9 provides improved timing performance by permitting higher currents with bounded hrs voltage excursions.

It has been discovered that the bit line voltage limiter 240 attached directly to the bit lines 226 formed and configured having the semiconductor switch 302 and can be connected to the shunt device or the resistive compensation device 914 described in FIG. 9 provides substantial reliability improvements by extending the mean time between failures (MTBF) of the non-volatile memory cells 106.

Figure 11:
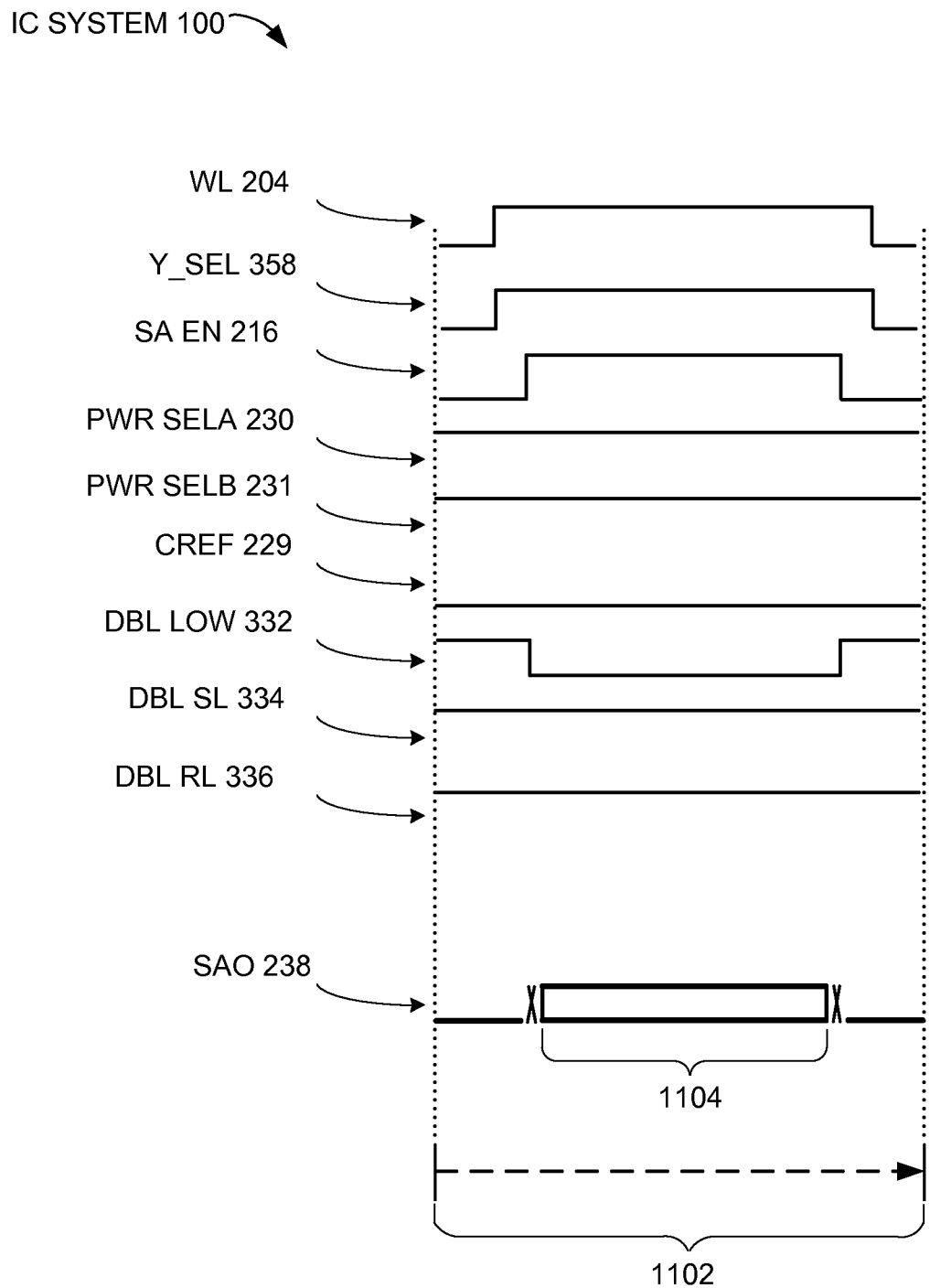
FIG. 11 is a memory cell read timing chart exemplifying a read operation sequence of the non-volatile memory cells of FIG. 3 of the integrated circuit system of FIG. 1.

Referring now to FIG. 11, therein is shown a memory cell read timing chart exemplifying a read operation sequence 1102 of the non-volatile memory cells 106 of FIG. 3 of the integrated circuit system 100 of FIG. 1. Shown are relative signal sequences used in the read operation to determine the data condition state for the non-volatile memory cells 106.

It is understood that individual signals, identified by reference name and number, are not displayed in any particular sequential order and are to be interpreted together as a group, from left to right as a function of advancing or increasing time. The signals are shown during the read operation sequence 1102.

Shown and labeled are one of the word lines 204 and the y_sel 358 transitioning from a low-to-high-to-low voltage level at substantially the same points in time. Shown next is shown, the sense amplifier enable 216 signal having a low-to-high-to-low voltage level transition occur while the word lines 204 and the y_sel 358 signals are at the high voltage level.

Next are the power sela 230 and the power selb 231 set at a high voltage level throughout the read operation sequence 1102. Shown next is the result on the cell reference 229 signal at a low voltage level as a direct result of the power sela 230 and the power selb 231 at a the high voltage level. Next is shown, the drive bit line lowlevel 332 signal having a high-to-low-to-high voltage level transition opposite voltage directions and at substantially the same points in time as the sense amplifier enable signal.

Next is shown, the drive bit line setlevel 334 and the reset reference voltage 340 set at a high voltage level throughout the read operation sequence 1102. A data validation window 1104 is shown on the sense amplifier output 238 line representing the content of the non-volatile memory cells 106, such as the data condition state of a one or zero, read during the read operation sequence 1102.

Figure 12:
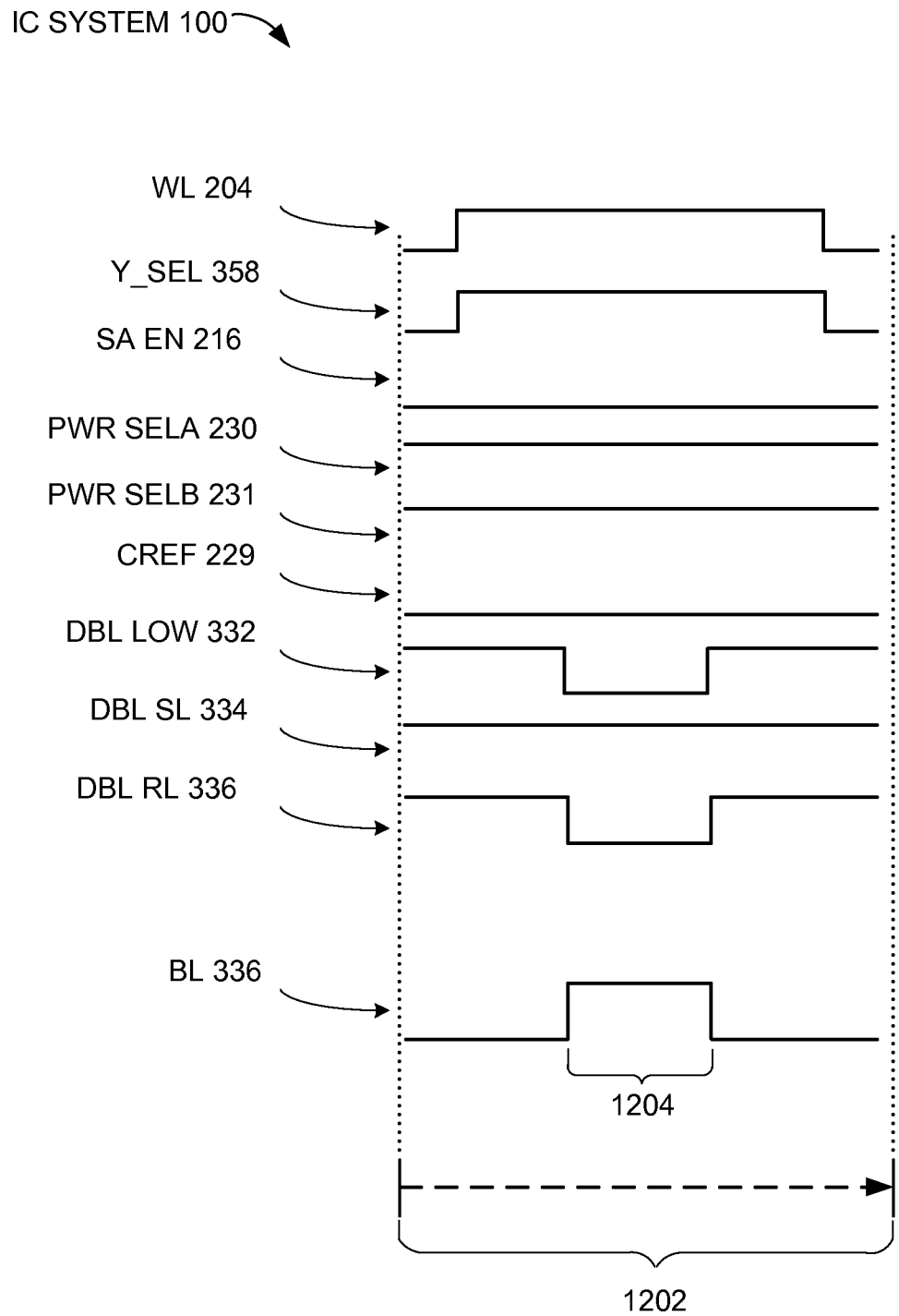
FIG. 12 is shown a memory cell reset timing chart exemplifying a write reset operation sequence of the non-volatile memory cells of FIG. 3 of the integrated circuit system of FIG. 1.

Referring now to FIG. 12, therein is shown a memory cell reset timing chart exemplifying a write reset operation sequence 1202 sequence of the non-volatile memory cells 106 of FIG. 3 of the integrated circuit system 100 of FIG. 1. It is understood that individual signals, identified by reference name and number, are not displayed in any particular sequential order and are to be interpreted together as a group, from left to right as a function of advancing or increasing time. The signals are shown during the write reset operation sequence 1202 to reset the content of the non-volatile memory cells 106 to the data condition state of a zero.

Shown and labeled are one of the word lines 204 and the y_sel 358 transitioning from a low-to-high-to-low voltage level at substantially the same points in time. Shown next is shown, the sense amplifier enable 216 signal having a low voltage level throughout the write reset operation sequence 1202.

Next are the power sela 230 and the power selb 231 set at a high voltage level throughout the write reset operation sequence 1202. Shown next is the result on the cell reference 229 signal at a low voltage level as a direct result of the power sela 230 and the power selb 231 at a high voltage level. Next is shown, the drive bit line lowlevel 332 signal having a high-to-low-to-high voltage level transition while the word lines 204 is transitioned to the high voltage level.

Next is shown, the drive bit line setlevel 334 is set at a high voltage level throughout the read operation sequence 1102 and the reset reference voltage 340 is transitioned high-to-low-to-high similar to and at substantially the same points in time as the drive bit line lowlevel 332. The data condition state of a zero is stored in the non-volatile memory cells 106 and appears on the one of the bit lines 226 signal during a write stored window 1204.

Figure 13:
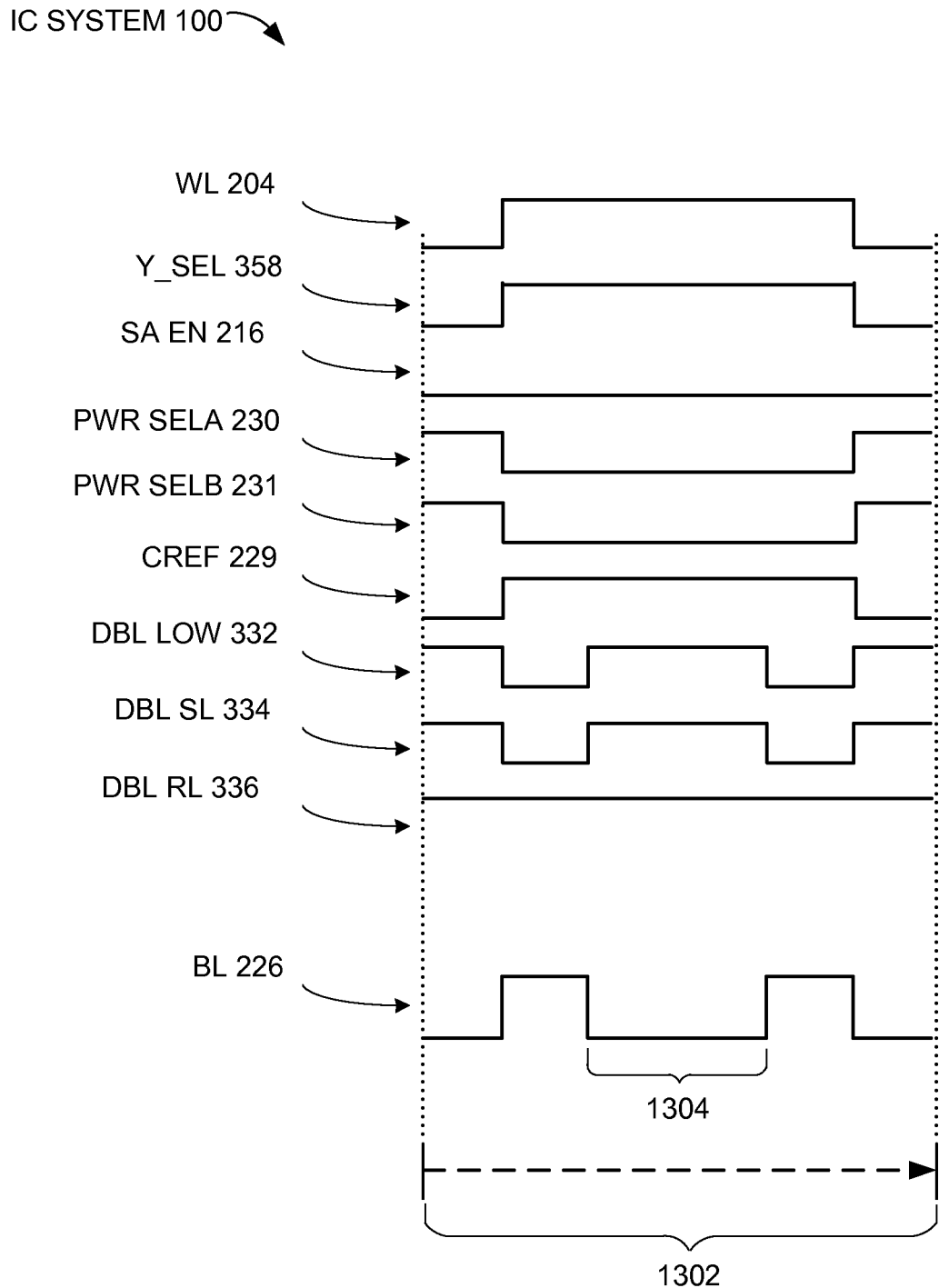
FIG. 13 is a memory cell set timing chart exemplifying a write set operation sequence of the non-volatile memory cells of FIG. 3 of the integrated circuit system of FIG. 1.

Referring now to FIG. 13, therein is shown a memory cell set timing chart exemplifying a write set operation sequence of the non-volatile memory cells 106 of FIG. 3 of the integrated circuit system 100 of FIG. 1. It is understood that individual signals, identified by reference name and number, are not displayed in any particular sequential order and are to be interpreted together as a group, from left to right as a function of advancing or increasing time. The signals are shown during the write set operation sequence 1302 to set the content of the non-volatile memory cells 106 to the data condition state of a one.

Shown and labeled are one of the word lines 204 and the y_sel 358 transitioning from a low-to-high-to-low voltage level at substantially the same points in time. Shown next is shown, the sense amplifier enable 216 signal having a low voltage level throughout the write set operation sequence 1302.

Next are the power sela 230 and the power selb 231 set at are transitioning from a high-to-low-to-high voltage level opposite voltage directions and at substantially the same points in time as the word lines 204. Shown next is the resulting result on the cell reference 229 signal transitioning from a low-to-high-to-low voltage level as a direct result of the power sela 230 and the power selb 231 signal transitions. Next is shown, both the drive bit line lowlevel 332 and the drive bit line setlevel 334 signals having a high-to-low-to-extended high and followed by a low-to-high voltage level transition while the word lines 204 is transitioned to the high voltage level.

Next is shown, the reset reference voltage 340 set to a high voltage level throughout the write set operation sequence 1302. The data condition state of a one is stored in the non-volatile memory cells 106 and appears on the one of the bit lines 226 signal during a write stored window 1304.

Figure 14:
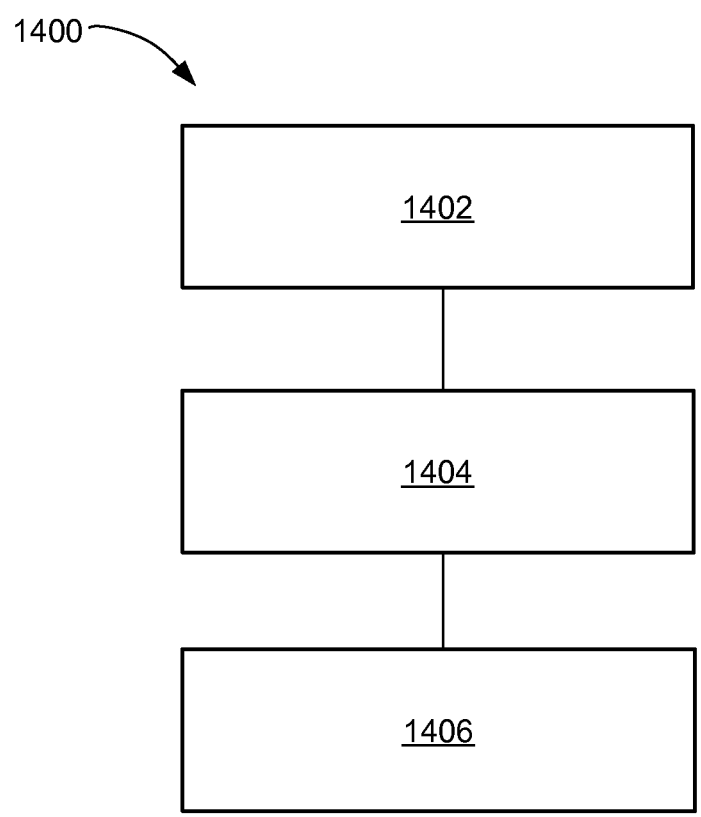
FIG. 14 is a flow chart of a method of manufacture of an integrated circuit system in a further embodiment of the present invention.

Referring now to FIG. 14, therein is shown a flow chart of a method 1400 of manufacture of an integrated circuit system in a further embodiment of the present invention. The method 1400 includes: providing an integrated circuit die in a block 1402; forming a non-volatile memory cell in the integrated circuit die and having a bit line for reading a data condition state of the non-volatile memory cell in a block 1404; and forming a voltage clamp in the integrated circuit die, the voltage clamp having a semiconductor switch connected to the bit line for reducing voltage excursions on the bit line in a block 1406.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

The voltage clamp or the bit line voltage limiter 240 can improve by reduction of over stress issues for HRS cell resistances. For example when BL rises up to $V_{th}$, the bit line voltage limiter 240 turns on and the current through the memory cell reduces. In another example, attaching a diode device for which Vth of the diode device works a voltage limiter of BL for HRS cell situations. In yet another example, a diode device can be replaced by a PMOS device or a voltage feedback loop. The present invention can improve memory operation by reducing read disturb characteristics and provides over voltage stress control for HRS cells during read.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit system comprising:
   providing an integrated circuit die;
   forming a non-volatile memory cell in the integrated circuit die and a bit line for reading a data condition state of the non-volatile memory cell; and
   forming a voltage clamp in the integrated circuit die, the voltage clamp having a semiconductor switch connected at a first end to the bit line and at a second end to a voltage limiter, wherein the semiconductor switch is for reducing voltage excursions on the bit line, wherein the voltage clamp limits voltages on the bit line to a predetermined threshold level when the non-volatile memory cell is in a high resistive state, wherein the semiconductor switch enables the voltage clamp only during memory read operations and disables the voltage clamp during memory write operations, and wherein forming the voltage limiter of the voltage clamp includes: forming a semiconductor current sink having a first end connected to the semiconductor switch and having a second end connected to ground, wherein the semiconductor switch is between the bit line and the semiconductor current sink, and forming an operational amplifier, wherein an output of the operational amplifier is connected to a gate of a transistor provided as part of the semiconductor current sink.

2. A method of manufacturing an integrated circuit system comprising:
   providing an integrated circuit die;
   forming a non-volatile memory cell in the integrated circuit die and a bit line for reading a data condition state of the non-volatile memory cell; and
   forming a voltage clamp in the integrated circuit die, the voltage clamp having a semiconductor switch connected at a first end to the bit line and at a second end to a voltage limiter, wherein the semiconductor switch is for reducing voltage excursions on the bit line, wherein the voltage clamp limits voltages on the bit line to a predetermined threshold level when the non-volatile memory cell is in a high resistive state, wherein the semiconductor switch enables the voltage clamp only during memory read operations and disables the voltage clamp during memory write operations, wherein forming the voltage clamp includes forming a resistive compensation device connected directly to the second end of the semiconductor switch, wherein the first end of the semiconductor switch is connected directly to the bit line, and wherein the resistive compensation device is a thermal sensitive resistor.

3. An integrated circuit system comprising:

an integrated circuit die;

a non-volatile memory cell in the integrated circuit die and having a bit line for reading a data condition state of the non-volatile memory cell;

a voltage clamp in the integrated circuit die, the voltage clamp having a semiconductor switch connected to the bit line for reducing voltage excursions on the bit line, wherein the voltage clamp limits voltages on the bit line to a predetermined threshold level when the non-volatile memory cell is in a high resistive state, wherein the semiconductor switch enables the voltage clamp only during memory read operations and disables the voltage clamp during memory write operations;

a resistive compensation device connected directly to a second end of the semiconductor switch, wherein a first end of the semiconductor switch is connected directly to the bit line, and wherein the resistive compensation device is a thermal sensitive resistor.

4. An integrated circuit system comprising:

an integrated circuit die;

a non-volatile memory cell in the integrated circuit die and having a bit line for reading a data condition state of the non-volatile memory cell;

a voltage clamp in the integrated circuit die, the voltage clamp having a semiconductor switch connected to the bit line for reducing voltage excursions on the bit line, wherein the voltage clamp limits voltages on the bit line to a predetermined threshold level when the non-volatile memory cell is in a high resistive state, wherein the semiconductor switch enables the voltage clamp only during memory read operations and disables the voltage clamp during memory write operations;

a semiconductor current sink connected between the semiconductor switch and ground; and an operational amplifier connected to the semiconductor current sink, wherein an output of the operational amplifier is connected to a gate of a transistor provided as part of the semiconductor current sink.

5. The method as claimed in claim 1, wherein a non-inverting input of the operational amplifier is connected to the second end of the semiconductor switch.

6. The method as claimed in claim 5, wherein an inverting input of the operational amplifier is connected to a reference voltage.

7. The system as claimed in claim 4, wherein a non-inverting input of the operational amplifier is connected to an output of the semiconductor switch.

8. The system as claimed in claim 7, wherein an inverting input of the operational amplifier is connected to a reference voltage.

\* \* \* \* \*